United States Patent
Van Haren et al.

(10) Patent No.: US 11,294,294 B2
(45) Date of Patent: Apr. 5, 2022

(54) ALIGNMENT MARK POSITIONING IN A LITHOGRAPHIC PROCESS

(71) Applicant: ASML NETHERLANDS B.V., Veldhoven (NL)

(72) Inventors: Richard Johannes Franciscus Van Haren, Waalre (NL); Leon Paul Van Dijk, Eindhoven (NL); Orion Jonathan Pierre Mouraille, Eindhoven (NL); Anne Marie Pastol, Montbonnot Saint Martin (FR)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/966,536

(22) PCT Filed: Feb. 6, 2019

(86) PCT No.: PCT/EP2019/052839
§ 371 (c)(1),
(2) Date: Jul. 31, 2020

(87) PCT Pub. No.: WO2019/166201
PCT Pub. Date: Sep. 6, 2019

(65) Prior Publication Data
US 2021/0048758 A1 Feb. 18, 2021

(30) Foreign Application Priority Data
Feb. 27, 2018 (EP) .................................. 18158779

(51) Int. Cl.
*G03F 7/20* (2006.01)
*G03F 9/00* (2006.01)
(52) U.S. Cl.
CPC ........ *G03F 9/7084* (2013.01); *G03F 7/70633* (2013.01); *G03F 9/7046* (2013.01)

(58) Field of Classification Search
CPC ............ G03F 7/70633; G03F 7/70783; G03F 7/70875; G03F 7/7088; G03F 7/70891; G03F 9/7046; G03F 9/7084; G03F 9/7088
See application file for complete search history.

(56) References Cited

U.S. PATENT DOCUMENTS 6,952,253 B2   10/2005   Lof et al.
2002/0037625 A1   3/2002   Kyoh et al.
(Continued)

FOREIGN PATENT DOCUMENTS

CN   107430356   12/2017
CN   107561875   1/2018
(Continued)

OTHER PUBLICATIONS

International Search Report and Written Opinion issued in corresponding PCT Patent Application No. PCT/EP2019/052839, dated Mar. 15, 2019.
(Continued)

*Primary Examiner* — Peter B Kim
(74) *Attorney, Agent, or Firm* — Pillsbury Winthrop Shaw Pittman LLP (57) ABSTRACT

Methods and apparatuses for determining a position of an alignment mark applied to a region of a first layer on a substrate using a lithographic process by: obtaining an expected position of the alignment mark; obtaining a geometrical deformation of the region due to a control action correcting the lithographic process; obtaining a translation of the alignment mark due to the geometrical deformation; and determining the position of the alignment mark based on the expected position and the translation.

20 Claims, 3 Drawing Sheets

(56) References Cited

U.S. PATENT DOCUMENTS

| | | |
|---|---|---|
| 2006/0016561 A1 | 1/2006 | Choi et al. |
| 2007/0002298 A1 | 1/2007 | Visser |
| 2007/0085991 A1 | 4/2007 | Liegl et al. |
| 2010/0214550 A1 | 8/2010 | Hulsebos et al. |
| 2011/0205510 A1 | 8/2011 | Menchtchikov et al. |
| 2012/0008127 A1 | 1/2012 | Tel et al. |
| 2012/0133914 A1 | 5/2012 | Prosyentsov et al. |
| 2013/0141723 A1 | 6/2013 | Wei et al. |
| 2015/0029481 A1 | 1/2015 | Prosyentsov et al. |
| 2015/0146188 A1* | 5/2015 | Lyulina ............... G03F 7/70141 355/77 |
| 2019/0086810 A1 | 3/2019 | Tel et al. |
| 2019/0137892 A1 | 5/2019 | Cekli et al. |

FOREIGN PATENT DOCUMENTS

| | | |
|---|---|---|
| EP | 3255493 | 12/2017 |
| EP | 3309617 | 4/2018 |
| EP | 3312672 | 4/2018 |
| EP | 3312693 | 4/2018 |
| JP | 2003031477 A * | 1/2003 ......... G03F 7/70633 |
| JP | 4053723 | 12/2007 |
| TW | 201142534 | 12/2011 |
| TW | 201227858 | 7/2012 |
| TW | 201805728 | 2/2018 |
| WO | 2011081645 | 7/2011 |
| WO | 2013092106 | 6/2013 |
| WO | 2015101458 | 7/2015 |
| WO | 2015110191 | 7/2015 |
| WO | 2017060080 | 4/2017 |
| WO | 2017140532 | 8/2017 |

OTHER PUBLICATIONS

Taiwanese Office Action issued in corresponding Taiwanese Patent Application No. 108105946, dated Dec. 27, 2019.

* cited by examiner

ALIGNMENT MARK POSITIONING IN A LITHOGRAPHIC PROCESS

CROSS-REFERENCE TO RELATED APPLICATIONS

This application is the U.S. national phase entry of PCT patent application no. PCT/EP2019/052839, which was filed on Feb. 6, 2019, which claims the benefit of priority of European patent application no. application 18158779.1 which was filed on Feb. 27, 2018 and which is incorporated herein in its entirety by reference.

FIELD

The invention relates to determining a position of alignment marks applied to a region of a layer on a substrate using a lithographic process. In some specific arrangements, the invention may also relate to positioning the substrate within a lithographic apparatus based on the determined position.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but are not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Typically, alignment marks are fabricated in a layer on the substrate and allow the substrate to be correctly positioned within a lithographic apparatus. An accurate determination of the position of the alignment marks has a direct impact on the accuracy with which subsequent layers may be exposed on the substrate.

Currently, the alignment mark locations are defined in an exposure job (or recipe) when the alignment marks are fabricated in a first layer. The alignment mark field coordinates can be taken from a reticle design file (GDS). The alignment mark field coordinates, together with the field exposure layout will be used to define an exposure grid. During wafer alignment within the lithographic apparatus, the alignment mark positions may be measured with an alignment sensor in a scanner reference grid and mapped to the positions as defined in the exposure job (or recipe). Static offsets (e.g. due to Reticle Writing Errors, Lens Slit Fingerprint, or applied corrections like iHOPC) are usually measured and corrected by an overlay feed-back control loop.

However, errors are still present in determining the position of the alignment marks and it is desirable to improve the accuracy of that determination.

SUMMARY

According to the invention in an aspect, there is provided a method for determining a position of an alignment mark applied to a region of a first layer on a substrate using a lithographic process, the method comprising: obtaining an expected position of the alignment mark; obtaining a geometrical deformation of the region due to a control action correcting the lithographic process; obtaining a translation of the alignment mark due to the geometrical deformation; and determining the position of the alignment mark based on the expected position and the translation.

Optionally, the control action has been determined based on metrology data obtained by a metrology apparatus.

Optionally, the control action has been determined as part of an Advanced Process Control (APC) strategy.

Optionally, the control action comprises factors relating to one or more of: heating of a lens of a lithographic apparatus; heating of a reticle within a lithographic apparatus; and heating of the substrate.

Optionally, the position of the alignment mark is determined based on a control action associated with a first field, and further comprising updating the determined position of the alignment mark based on a control action associated with a second field.

Optionally, the control action associated with a first field is different to the control action associated with a second field.

Optionally, the control action is for correcting a field geometry property of the lithographic process.

Optionally, the field geometry property comprises overlay.

Optionally, the expected position of the alignment mark is obtained from an exposure recipe.

Optionally, obtaining the geometrical deformation of the region comprises measuring a position of the alignment mark after exposure of the first layer and/or calculating the geometrical deformation of the region based on the control action.

Optionally, the method further comprises exposing the first layer on the substrate comprising the alignment mark.

According to the invention in an aspect, there is provided a method for positioning a substrate subject to a lithographic process comprising determining a position of an alignment mark fabricated as part of a first layer on the substrate according to any preceding embodiment, and further comprising positioning the substrate based on the determined position of the alignment mark.

Optionally, the method further comprises exposing a second layer of the substrate.

According to the invention in an aspect, there is provided an apparatus for determining a position of an alignment mark applied to a region of a first layer on a substrate using a lithographic process, the apparatus comprising a processor configured to execute computer program code to undertake the method of: obtaining an expected position of the alignment mark; obtaining a geometrical deformation of the region due to a control action correcting the lithographic process; obtaining a translation of the alignment mark due to the geometrical deformation; and determining the position of the alignment mark based on the expected position and the translation.

Optionally, the control action has been determined based on metrology data obtained by a metrology apparatus.

Optionally, the control action has been determined as part of an Advanced Process Control (APC) strategy.

Optionally, the control action comprises factors relating to one or more of: heating of a lens of a lithographic apparatus; heating of a reticle within a lithographic apparatus; and heating of the substrate.

Optionally, the position of the alignment mark is determined based on a control action associated with a first field, Optionally, the method further comprises updating the determined position of the alignment mark based on a control action associated with a second field.

Optionally, the control action associated with a first field is different to the control action associated with a second field.

Optionally, the control action is for correcting a field geometry property of the lithographic process.

Optionally, the field geometry property comprises overlay.

Optionally, the expected position of the alignment mark is obtained from an exposure recipe.

Optionally, obtaining the geometrical deformation of the region comprises measuring a position of the alignment mark after exposure of the first layer and/or calculating the geometrical deformation of the region based on the control action.

Optionally, the method further comprising exposing the first layer on the substrate comprising the alignment mark.

According to the invention in an aspect, there is provided an apparatus for positioning a substrate subject to a lithographic process, the apparatus comprising a processor configured to execute computer program code to undertake a method comprising: determining a position of an alignment mark fabricated as part of a first layer on the substrate according to any method disclosed herein; and further comprising controlling the apparatus to position the substrate based on the determined position of the alignment mark.

Optionally, the method further comprises exposing a second layer of the substrate.

According to the invention in an aspect, there is provided a computer program comprising instructions which, when executed on at least one processor, cause the at least one processor to control an apparatus to carry out a method according to any disclosed herein.

According to the invention in an aspect, there is provided a carrier containing the computer program mentioned above, wherein the carrier is one of an electronic signal, optical signal, radio signal, or non-transitory computer readable storage medium.

According to the invention in an aspect, there is provided a metrology apparatus comprising an apparatus according to any disclosed herein.

According to the invention in an aspect, there is provided a lithographic apparatus comprising the metrology apparatus disclosed above.

According to the invention in an aspect, there is provided a lithographic cell comprising the apparatus described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
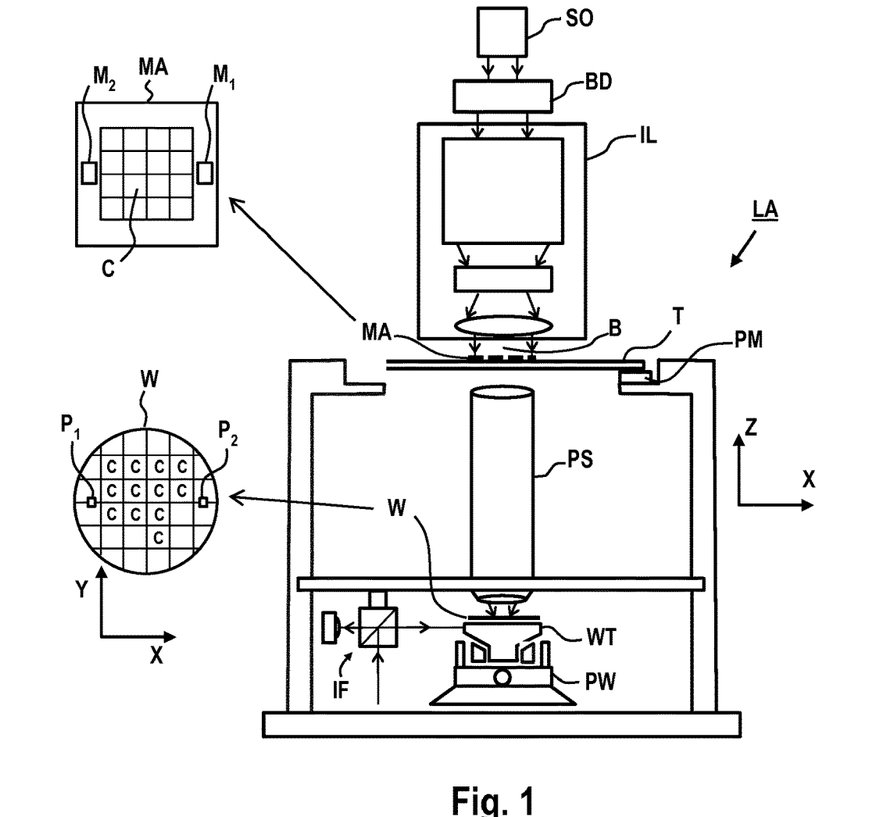
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated may occupy dedicated target portions, they may be located in spaces between target portions. Substrate alignment marks P1, P2 are known as scribe-lane alignment marks when these are located between the target portions C.

Figure 2:
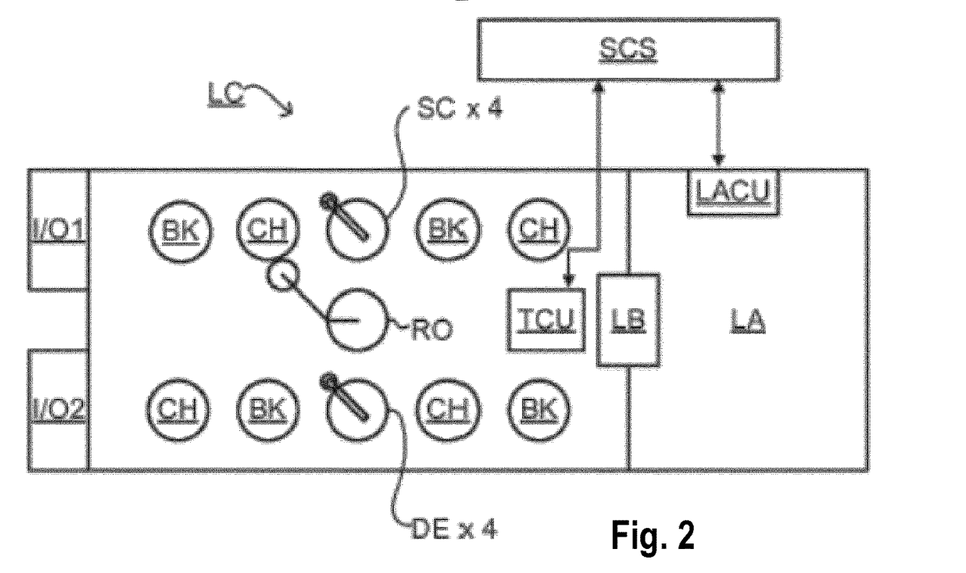
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
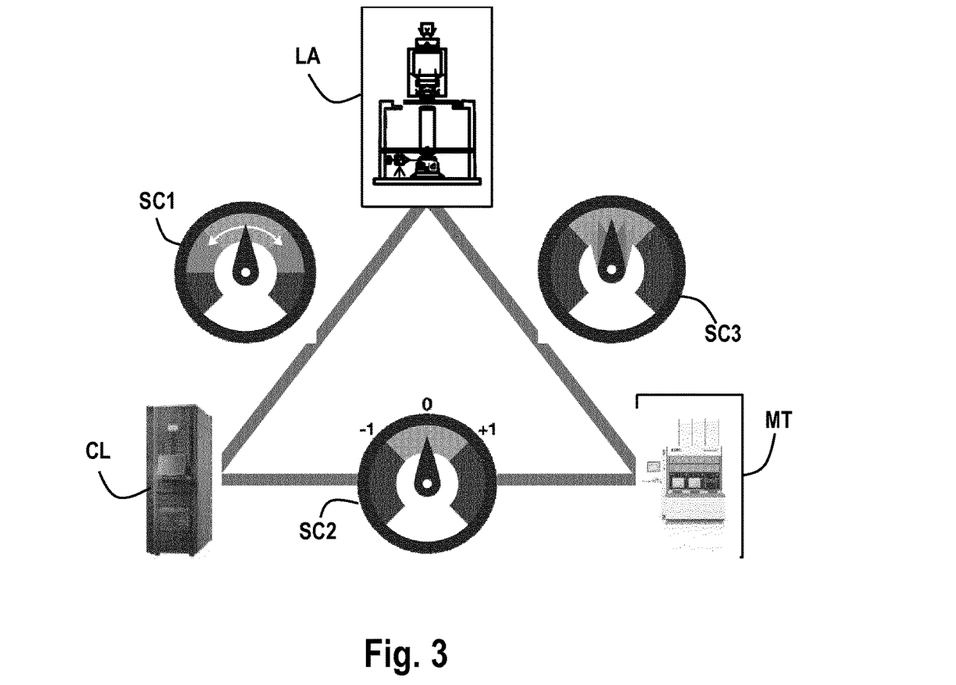
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by obtaining an expected position of the alignment marks, which may be done by measuring positions of alignment marks on the substrate using an alignment sensor or by obtaining the expected position from an exposure recipe. More information on the alignment procedure can be found in U.S. Patent Application Publication No. US20100214550, which is incorporated herein by reference. Pattern dimensioning (CD) errors may e.g. occur when the substrate is not positioned correctly with respect to a focal plane of the lithographic apparatus. These focal position errors may be associated with un-flatness of a substrate surface. The lithographic apparatus minimizes these focal positon errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may e.g. be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs it is of great importance that the process conditions for processing substrates using processing apparatus such as the lithographic apparatus or etching station remain stable such that properties of the features remain within certain control limits. Stability of the process is of particular importance for features of the functional parts of the IC, the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference.

A typical APC implementation involves periodic measurements on metrology features on the substrates to monitor and correct drifts associated with one or more processing apparatus by undertaking a control action (described below). The metrology features reflect the response to lithographic process variations of the product features. The sensitivity of the metrology features to process variations may be different compared to the product features. In that case a so-called "Metrology To Device" offset (further also referenced to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of the locations across the substrate and/or patterning device where the metrology targets are present and/or measured is often referred to as the "sampling scheme". Typically the sampling scheme is selected based on an expected fingerprint of the relevant process parameter(s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput of the lithographic process. A carefully selected sampling scheme is important to accurately control the lithographic process without affecting throughput and/or assigning a too large area on the reticle or substrate to metrology features. Technology related to optimal positioning and/or measuring metrology targets is often referred to as "scheme optimization". More information on scheme optimization can be found in international Patent Application Publication No. WO 2015110191 and the European patent application, application number EP16193903.8 which are incorporated herein by reference.

Besides metrology measurement data also context data may be used for process control. Context data may comprise data relating to one or more of: the selected processing tools (out of the pool of processing apparatus), specific characteristics of the processing apparatus, the settings of the processing apparatus, the design of the circuit pattern and measurement data relating to processing conditions (for example wafer geometry). Examples of using context data for process control purposes may be found in the European patent application, application number EP16156361.4, and the international patent application, application number PCT/EP2016/072363 which are incorporated herein by reference. Context data may be used to control or predict processing in a feed-forward manner in case the context data relates to process steps performed before the currently controlled process step. Often context data is statistically correlated to product feature properties. This enables context driven control of processing apparatus in view of achieving optimal product feature properties. Context data and metrology data may also be combined e.g. to enrich sparse metrology data to an extent that more detailed (dense) data becomes available which is more useful for control and/or diagnostic purposes. More information on combining context data and metrology data can be found in U.S. Patent provisional, application Ser. No. 62/382,764 which is incorporated herein by reference.

As said monitoring the process is based on acquisition of data related to the process. The required data sampling rate (per lot or per substrate) and sampling density depend on the required level of accuracy of pattern reproduction. For low-k1 lithographic processes even small substrate to substrate process variations may be significant. The context data and/or metrology data then need to enable process control on a per substrate basis. Additionally when a process variation gives rise to variations of a characteristic across the substrate the context and/or metrology data need to be sufficiently densely distributed across the substrate. However the time available for metrology (measurements) is limited in view of the required throughput of the process. This limitation imposes that the metrology tool may measure only on selected substrates and selected locations across the substrate. The strategies to determine what substrates need to be measured are further described in the European patent applications, application number EP16195047.2 and EP16195049.8 which are incorporated herein by reference.

In practice it is often necessary to derive from a sparse set of measurement values relating to a process parameter (across a substrate or plurality of substrates) a denser map of values associated with the substrate(s). Typically such a dense map of measurement values may be derived from the sparse measurement data in conjunction with a model associated with an expected fingerprint of the process parameter. More information on modeling measurement data can be found in international Patent Application Publication No. WO 2013092106 which is incorporated herein by reference.

The inventors have appreciated that in a production environment control actions that correct errors in a lithographic process are dynamic They may vary over time and/or from lot to lot. Although the goal would be to achieve a stable/static correction per field, small residual fluctuations between the measured and expected positions of alignment marks may still exist. For instance, while the current intra-field (process) corrections can be up to a third order polynomial and may vary from field to field, the alignment mark will pick up a translation off-set. Translation noise observed in the measured overlay trend plots might therefore be directly linked to the dynamically applied (higher order) process corrections.

Figure 4:
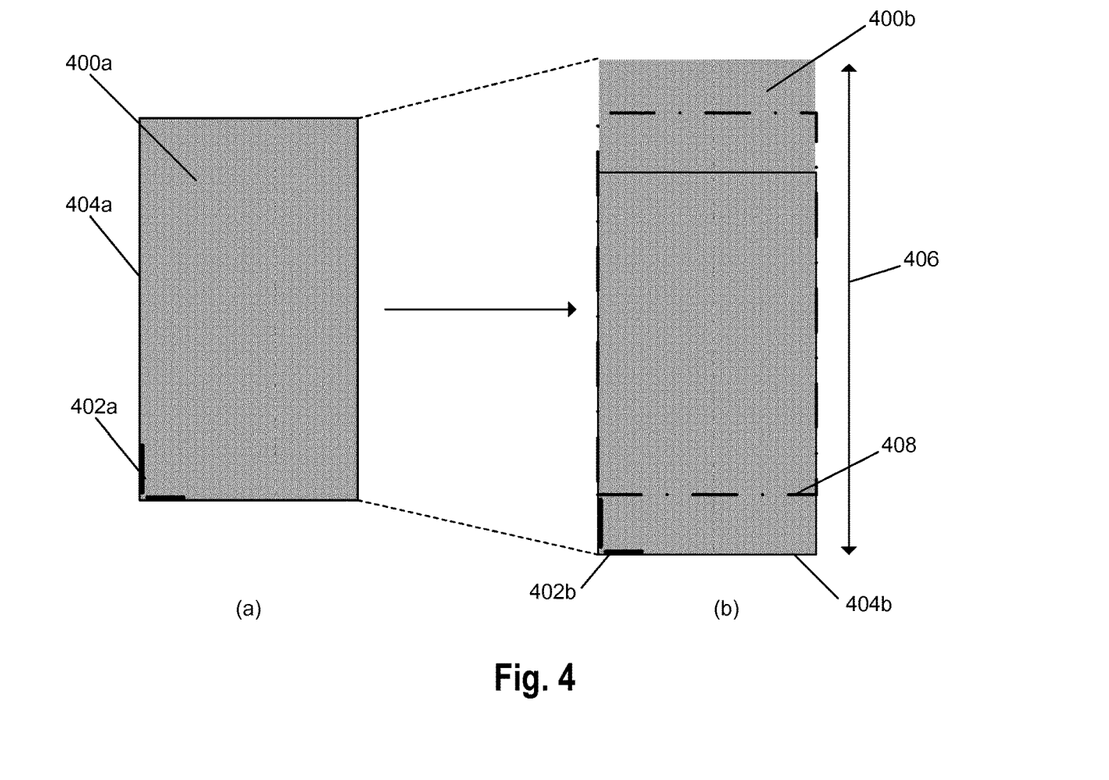
FIG. 4 depicts a translation of an alignment mark due to a geometrical deformation of an exposure field.

Exemplary methods and apparatus disclosed herein may be considered in view of FIG. 4. In FIG. 4a, a reticle 400a (the shaded rectangle) for a first layer comprises an alignment mark 402a. The alignment mark 402a comprises a pair of lines indicating a coordinate (in this case 0,0) against which a second layer reticle 404a (the line surrounding the shaded rectangle of the first layer reticle 400a) can be aligned. In FIG. 4a, the second layer reticle 404a is aligned perfectly with respect to the first layer reticle 400a using the alignment mark 402a.

However, as shown in FIG. 4b, the first layer reticle 400b may be subjected to a control action for correcting the lithographic process of fabricating the first layer. The control action may be implemented during exposure of the first layer. In the example of FIG. 4b, the control action comprises a magnification y-offset 406, which increases the y-dimension of the exposed reticle 400b. The control action may be as a result of an APC correction, explained above and known to a skilled person. The control action may be part of a process for improving a field geometry property and may specifically be for improving an overlay parameter. The control action may take a number of forms and the magnification y-offset is used as an example only. For example, control actions may comprise any one or more of the following: a lens manipulator providing a field distortion correction; a lens manipulator providing a field magnification correction; and controlling a stage in time (stage movement profile) to achieve desired positioning of features (example: accelerating stage first and decelerating afterwards effectively causes a field Y magnification as features during the beginning of the scan are distributed less densely than features exposed when stage is at its maximum speed).

As previously mentioned, the position of the alignment mark 402a is defined in an exposure job or recipe. The alignment mark position may deviate from the expected position (e.g. defined by the recipe) due to the applied control action. This is shown in FIG. 4b, in which the alignment mark 402b has undergone a translation due to the magnification y-offset 406. The translation may be calculated and is equal to $\Delta y = M_y \cdot Y_{Field}$, where $M_y$ is the applied magnification in the y-axis and $Y_{Field}$ is the field coordinate, which in this case is $(0, Y_{Field})$ as an example. Therefore, the true position of the alignment Field, mark is $(0, \Delta y)$.

If the second layer reticle 404b is aligned with the alignment mark then the second layer will not be correctly positioned with respect to the first layer, due to the control action undertaken when exposing the first layer. The second layer will be exposed based on the designed (expected) coordinates of the alignment mark $(0, Y_{Field})$ in the exposure job (or recipe). That is, the second layer reticle 404b is aligned with respect to the lower left corner of the first layer reticle 400b. This means that in addition to the expected $M_y$ overlay penalty, a translation penalty $T_y = (0, \Delta y)$ will be observed as well.

The inventors have appreciated that the translation penalty $T_y$ in the second layer compared to the first layer overlay can be eliminated or at least mitigated based on knowledge of the control action. The position of the alignment mark 402b in the exposed first layer may be determined based on the translation $\Delta y$ due to the control action, e.g. by adding the translation $\Delta y$ to the expected position of the alignment mark, which may be defined in the exposure job (or recipe).

The second layer reticle 404b may be realigned based on the determined translation of the alignment mark. In the case shown in FIG. 4, this results in a shift of the second layer reticle 404b in the y-direction to a position shown by the hatched rectangle 408. If the control action applied to the first layer reticle 400b, e.g. field magnification y-offset, is also employed in exposure of the second layer, the measured overlay penalty will not be affected (or the effect will be reduced) by the control action. In this example, a field magnification is used to illustrate the idea although other control actions are encompassed by the methods disclosed.

Typically, the reticles for the first and/or second layers 400a, 400b, 404a, 404b comprise product features as well as the alignment marks 402a, 402b, although this is not essential to the implementation of arrangements disclosed herein.

Figure 5:
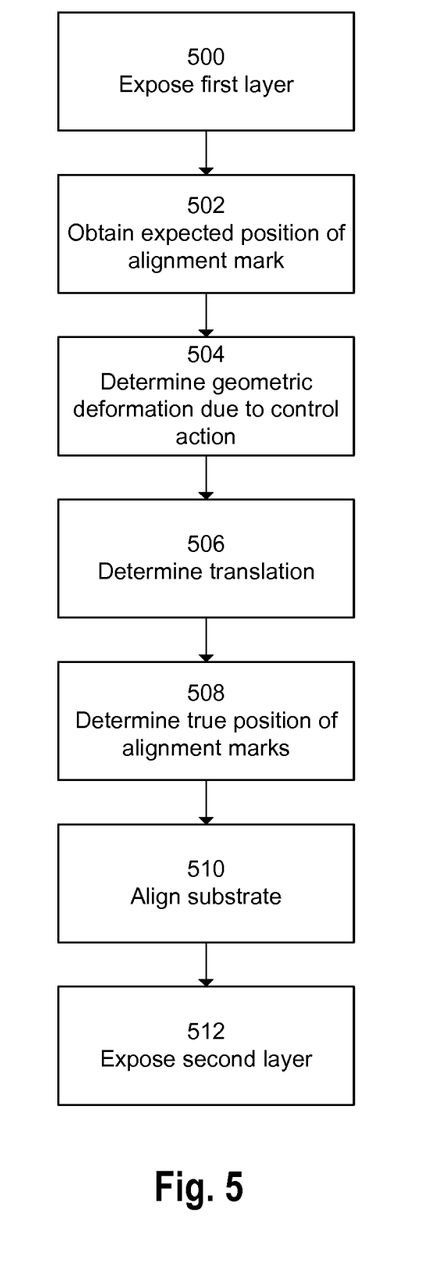
FIG. 5 depicts a flow diagram of a method according to an embodiment of the disclosure.

FIG. 5 shows a flow diagram of a method for exposing first and second layers on a substrate. The method of FIG. 5 comprises methods for determining a position of an alignment mark applied to a region of the substrate.

As a first step, the first layer is exposed 500 onto the substrate, although this is not an essential step and need not be included in methods disclosed herein. The first layer may be exposed using apparatus disclosed herein or other apparatus and includes an alignment mark. In most practical implementations, the first layer also comprises product features for fabricating a device, although this is not essential. Also, the region of the substrate may be a field.

As described above, the exposure of the first layer may be subjected to a control action to correct for an error in the lithographic process used in exposing the first layer. The control action may be determined based on metrology data obtained by a metrology apparatus, as described above. In a specific example, the control action may be determined as part of an APC strategy. The control action may correct for one or more errors introduced into the lithographic process by the lithographic apparatus, such as any of: heating of a lens of the lithographic apparatus; heating of the reticle within the lithographic apparatus; and heating of the substrate. The control action may be for correcting a field geometry property, such as overlay error.

An expected position of the alignment mark is obtained 502. This is typically done by reference to the exposure job (or recipe). The expected position may be a coordinate or other reference defining the position of the alignment mark in the region of the substrate based on a reticle used during the exposure of the first layer. The expected position may assume that no control action has been undertaken.

Based on the control action undertaken during exposure of the first layer, a geometric deformation of the first layer caused by the control action may be determined 504. This may be done by calculation, as discussed above with reference to FIG. 4. Alternatively, the geometric deformation may be determined by measuring a position of the alignment mark in the exposed first layer. The translation of the alignment mark is determined 506 based on the geometric deformation. The true position of the alignment marks may be determined 508 based on the determined translation.

In some exemplary arrangements, the determined true position of the alignment mark may be used to align 510 the substrate before a second layer is exposed 512.

In some exemplary arrangements, the alignment of the substrate before exposure of the second layer may be to account for the same control action as that undertaken during exposure of the first layer. In other exemplary arrangements, the alignment of the substrate before exposure of the second layer may be based on a second control action that will be undertaken when exposing the second layer and that is different to the control action of the first layer. In yet further arrangements, the region of the substrate may be a field and the true position of the alignment mark may be determined based on a first control action associated with a first field and the method may further comprise updating the determined true position based on a further control action, which may be different to the first control action, associated with a further field.

The invention is applicable to prevent cross talk between applied field corrections and wafer corrections as well. This is the case when the field corrections are different from field to field. Examples are lens heating, reticle heating, higher order process correction that may vary from field to field, baseliner corrections. Apart from translation, other wafer parameters get impacted as well. In some exemplary arrangements, time dependent field geometry changes may occur due to heating effects occurring during exposure of a single wafer. Effectively each field on the wafer may therefore be deformed slightly differently as each field is exposed at a slightly different time. In practice each field will therefore receive a dedicated control action (control per exposure=CPE) with, as a consequence, a slightly different alignment mark translation. Hence the mark shift (translation) across the first layer is not a constant, but is a function of the field (index). For a second exposure (second layer) this needs to be taken into account, together with again a potential effect of heating on the positioning of features to the second layer.

Further embodiments of the disclosure are disclosed in the list of numbered embodiments below:

1. A method for determining a position of an alignment mark applied to a region of a first layer on a substrate using a lithographic process, the method comprising:
   obtaining an expected position of the alignment mark;
   obtaining a geometrical deformation of the region due to a control action correcting the lithographic process;
   obtaining a translation of the alignment mark due to the geometrical deformation; and
   determining the position of the alignment mark based on the expected position and the translation.
2. The method according to embodiment 1, wherein the control action has been determined based on metrology data obtained by a metrology apparatus.
3. The method according to embodiment 1 or 2, wherein the control action has been determined as part of an Advanced Process Control (APC) strategy.
4. The method according to any preceding embodiment, wherein the control action comprises factors relating to one or more of: heating of a lens of a lithographic apparatus; heating of a reticle within a lithographic apparatus; and heating of the substrate.
5. The method according to any preceding embodiment, wherein the position of the alignment mark is determined based on a control action associated with a first field,
   and further comprising updating the determined position of the alignment mark based on a control action associated with a second field.
6. The method according to embodiment 5, wherein the control action associated with a first field is different to the control action associated with a second field.
7. The method according to any preceding embodiment, wherein the control action is for correcting a field geometry property of the lithographic process.
8. The method according to embodiment 7, wherein the field geometry property comprises overlay.
9. The method according to any preceding embodiment, wherein the expected position of the alignment mark is obtained from an exposure recipe.
10. The method according to any preceding embodiment, wherein obtaining the geometrical deformation of the region comprises measuring a position of the alignment mark after exposure of the first layer and/or calculating the geometrical deformation of the region based on the control action.
11. The method according to any preceding embodiment, further comprising exposing the first layer on the substrate comprising the alignment mark.
12. A method for positioning a substrate subject to a lithographic process comprising determining a position of an alignment mark fabricated as part of a first layer on the substrate according to any preceding embodiment, and further comprising positioning the substrate based on the determined position of the alignment mark.

13. The method according to embodiment 12, further comprising exposing a second layer of the substrate.

14. An apparatus for determining a position of an alignment mark applied to a region of a first layer on a substrate using a lithographic process, the apparatus comprising a processor configured to execute computer program code to undertake the method of:
   obtaining an expected position of the alignment mark;
   obtaining a geometrical deformation of the region due to a control action correcting the lithographic process;
   obtaining a translation of the alignment mark due to the geometrical deformation; and
   determining the position of the alignment mark based on the expected position and the translation.

15. The apparatus according to embodiment 14, wherein the control action has been determined based on metrology data obtained by a metrology apparatus.

16. The apparatus according to embodiment 14 or 15, wherein the control action has been determined as part of an Advanced Process Control (APC) strategy.

17. The apparatus according to any of embodiments 14 to 16, wherein the control action comprises factors relating to one or more of: heating of a lens of a lithographic apparatus; heating of a reticle within a lithographic apparatus; and heating of the substrate.

18. The apparatus according to any of embodiments 14 to 17, wherein the position of the alignment mark is determined based on a control action associated with a first field,
   The method further comprising updating the determined position of the alignment mark based on a control action associated with a second field.

19. The apparatus according to embodiment 18, wherein the control action associated with a first field is different to the control action associated with a second field.

20. The apparatus according to any of embodiments 14 to 19, wherein the control action is for correcting a field geometry property of the lithographic process.

21. The apparatus according to embodiment 20, wherein the field geometry property comprises overlay.

22. The apparatus according to any of embodiments 14 to 21, wherein the expected position of the alignment mark is obtained from an exposure recipe.

23. The apparatus according to any of embodiments 14 to 22, wherein obtaining the geometrical deformation of the region comprises measuring a position of the alignment mark after exposure of the first layer and/or calculating the geometrical deformation of the region based on the control action.

24. The apparatus according to any of embodiments 14 to 23, the method further comprising exposing the first layer on the substrate comprising the alignment mark.

25. An apparatus for positioning a substrate subject to a lithographic process, the apparatus comprising a processor configured to execute computer program code to undertake a method comprising: determining a position of an alignment mark fabricated as part of a first layer on the substrate according to any of embodiments 1 to 13; and further comprising controlling the apparatus to position the substrate based on the determined position of the alignment mark.

26. The apparatus according to embodiment 25, wherein the method further comprises exposing a second layer of the substrate.

27. A computer program comprising instructions which, when executed on at least one processor, cause the at least one processor to control an apparatus to carry out a method according to any one of embodiments 1 to 13.

28. A carrier containing the computer program according to embodiment 27, wherein the carrier is one of an electronic signal, optical signal, radio signal, or non-transitory computer readable storage medium.

29. A metrology apparatus comprising the apparatus according to any one of embodiments 14 to 26.

30. A lithographic apparatus comprising the metrology apparatus according to embodiment 29.

31. A lithographic cell comprising the apparatus according to embodiment 30.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

The skilled person will be able to envisage other embodiments without departing from the scope of the appended claims.

The invention claimed is:

1. A method comprising:
obtaining an expected position of an alignment mark applied to a region of a layer on a substrate using a lithographic process;
obtaining a geometrical deformation of the region due to a control action correcting the lithographic process;
obtaining a translation of the alignment mark due to the geometrical deformation; and
determining, by a hardware computer system, a position of the alignment mark based on the expected position and the translation.

2. The method according to claim 1, wherein the control action has been determined based on metrology data obtained by a metrology apparatus.

3. The method according to claim 1, wherein the control action has been determined as part of an Advanced Process Control (APC) strategy.

4. The method according to claim 1, wherein the control action comprises a factor relating to one or more selected from: heating of a lens of a lithographic apparatus; heating of a reticle within a lithographic apparatus; and/or heating of the substrate.

5. The method according to claim 1, wherein the position of the alignment mark is determined based on a control action associated with a first field, and
further comprising updating the determined position of the alignment mark based on a control action associated with a second field.

6. The method according to claim 5, wherein the control action associated with a first field is different to the control action associated with a second field.

7. The method according to claim 1, wherein the control action is for correcting a field geometry property of the lithographic process.

8. The method according to claim 7, wherein the field geometry property comprises overlay.

9. The method according to claim 1, wherein the expected position of the alignment mark is obtained from an exposure recipe.

10. The method according to claim 1, wherein obtaining the geometrical deformation of the region comprises measuring a position of the alignment mark after exposure of the layer and/or calculating the geometrical deformation of the region based on the control action.

11. The method according to claim 1, further comprising exposing the layer on the substrate comprising the alignment mark.

12. The method according to claim 1, further comprising positioning the substrate based on the determined position of the alignment mark.

13. The method according to claim 12, further comprising exposing a further layer of the substrate.

14. An apparatus for determining a position of an alignment mark applied to a region of a layer on a substrate using a lithographic process, the apparatus comprising computer program code and a processor configured to execute the computer program code, the computer program code, upon execution by the processor, configured to cause the processor to at least:
obtain an expected position of the alignment mark;
obtain a geometrical deformation of the region due to a control action correcting the lithographic process;
obtain a translation of the alignment mark due to the geometrical deformation; and
determine the position of the alignment mark based on the expected position and the translation.

15. A computer program product comprising a non-transitory computer-readable medium comprising instructions therein, the instructions, when executed on at least one processor, are configured to cause the at least one processor to at least:
obtain an expected position of an alignment mark applied to a region of a layer on a substrate using a lithographic process;
obtain a geometrical deformation of the region due to a control action correcting the lithographic process;
obtain a translation of the alignment mark due to the geometrical deformation; and
determine a position of the alignment mark based on the expected position and the translation.

16. The computer program product according to claim 15, wherein the control action has been determined based on metrology data obtained by a metrology apparatus.

17. The computer program product according to claim 15, wherein the control action has been determined as part of an Advanced Process Control (APC) strategy.

18. The computer program product according to claim 15, wherein the control action comprises a factor relating to one or more selected from: heating of a lens of a lithographic apparatus; heating of a reticle within a lithographic apparatus; and/or heating of the substrate.

19. The computer program product according to claim 15, wherein the position of the alignment mark is determined based on a control action associated with a first field, and
the instructions are further configured to cause the at least one processor to update the determined position of the alignment mark based on a control action associated with a second field.

20. The computer program product according to claim 15, wherein the control action is for correcting a field geometry property of the lithographic process.

* * * * *

UNITED STATES PATENT AND TRADEMARK OFFICE
CERTIFICATE OF CORRECTION

PATENT NO. : 11,294,294 B2  
APPLICATION NO. : 16/966536  
DATED : April 5, 2022  
INVENTOR(S) : Van Haren et al.

Page 1 of 1

It is certified that error appears in the above-identified patent and that said Letters Patent is hereby corrected as shown below:

On the Title Page

Item (72) Inventors  
Please correct third inventor "Orion Jonathan Pierre MOURAILLE, Eindhoven, Netherlands" to "Orion Jonathan Pierre MOURAILLE, Eersel, Netherlands"

Signed and Sealed this  
Second Day of August, 2022

Katherine Kelly Vidal  
*Director of the United States Patent and Trademark Office*